(12) United States Patent
Hashimura

(10) Patent No.: US 7,907,025 B2
(45) Date of Patent: Mar. 15, 2011

(54) ELECTROMECHANICAL RESONATOR AND MANUFACTURING METHOD THEREOF

(75) Inventor: Akinori Hashimura, Hyogo (JP)

(73) Assignee: Panasonic Corporation, Osaka (JP)

( * ) Notice: Subject to any disclaimer, the term of this patent is extended or adjusted under 35 U.S.C. 154(b) by 125 days.

(21) Appl. No.: 12/017,186

(22) Filed: Jan. 21, 2008

(65) Prior Publication Data
US 2008/0266008 A1   Oct. 30, 2008

(30) Foreign Application Priority Data
Jan. 23, 2007  (JP) .................. 2007-012924

(51) Int. Cl.
*G04C 3/10* (2006.01)
(52) U.S. Cl. ............. 331/116 M; 331/154; 333/187; 333/197
(58) Field of Classification Search .......... 331/116 M, 331/154; 333/187, 197
See application file for complete search history.

(56) References Cited

U.S. PATENT DOCUMENTS
6,940,370 B2 * 9/2005 Bircumshaw et al. ....... 333/197
2008/0150647 A1 * 6/2008 Yang et al. .................. 331/154

FOREIGN PATENT DOCUMENTS
JP   06-310029   4/1994

OTHER PUBLICATIONS

Mustafa U. Demirci and Clark T.-C. Nguyen, Higher-Mode Free-Free Beam Micromechanical Resonators, Proceedings, May 5-8, 2003, pp. 810-818, USA.

* cited by examiner

*Primary Examiner* — Robert Pascal
*Assistant Examiner* — James E Goodley
(74) *Attorney, Agent, or Firm* — Pearne & Gordon LLP

(57) ABSTRACT

An electromechanical resonator includes a resonator portion which includes a fixed electrode and an oscillator formed separately from the fixed electrode with a gap. The gap has a first gap region and a second gap region which are arranged in a thickness direction of the fixed electrode. The first gap region is different in width from the second gap region.

18 Claims, 16 Drawing Sheets

FIG. 12A
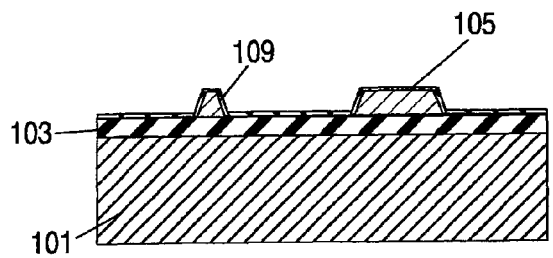
FIG. 12B
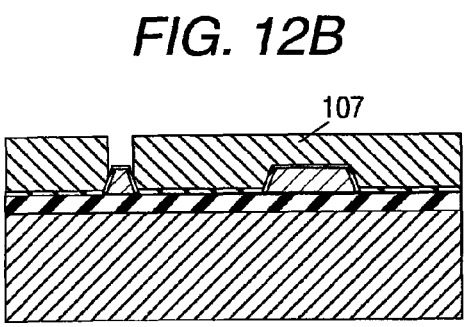
FIG. 12C
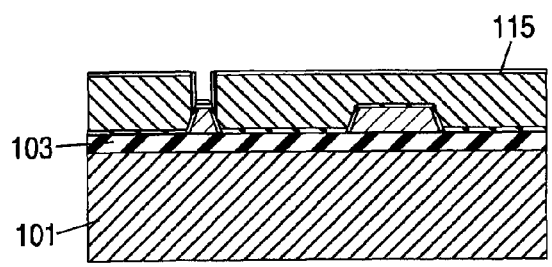
FIG. 12D
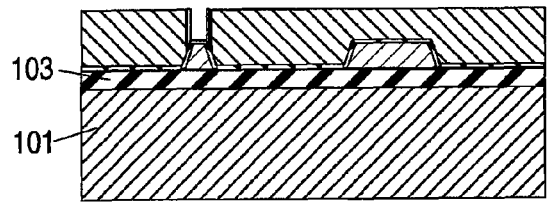
FIG. 12E
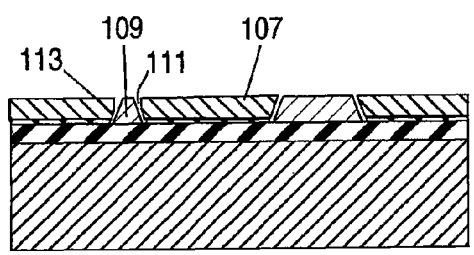
FIG. 12F

ELECTROMECHANICAL RESONATOR AND MANUFACTURING METHOD THEREOF

BACKGROUND

The present invention relates to an electromechanical resonator fabricated by using the MEMS (Micro Electro Mechanical Systems) and a manufacturing method thereof.

In related electromechanical devices, configurations for operating an oscillator with various driving systems are applied. An electromechanical element that translates in parallel with respect to a substrate is used in a large number of devices. To mechanically operate the oscillator of such an electromechanical device, an input/output terminal of a fixed electrode arranged over the side face of the oscillator is required.

A method has been proposed for changing the vibration mode by changing the thickness of an electrode in the electromechanical devices.

For example, an electromechanical resonator described in Non-patent Reference 1 is proposed.

As shown in FIG. 18, the electromechanical resonator includes a beam-shaped oscillator which has both ends supported as free ends. A uniform air gap 53 is formed between a fixed electrode 51 and an oscillator 52 provided on a substrate 50. An electrostatic force is exerted in the air gap to control the oscillator to vibrate mechanically. While a resonance frequency is determined mainly by a vibration mode that depends on the electrode arrangement of the fixed electrode 51, a secondary flexural vibration mode is excited (FIG. 18(b)) in a configuration where two electrodes 51 of input and output terminals are arranged in the lower layer of the oscillator 52 as shown in FIG. 18(a). When three electrodes 51 are arranged in the lower layer of the oscillator 52, a tertiary flexural vibration mode is excited at a resonance frequency higher than that of the secondary mode. Positioning of the electrode arrangement means that the vibration mode is different depending on an arrangement of the electrode 51 with respect to an anti-node position of vibration.

Therefore, in case an electromechanical resonator having various resonance frequencies is required, it is necessary to make variable the size and arrangement of a fixed electrode depending on the vibration mode to be excited. Also, a manufacturing method for simply manufacturing such an electrode is required.

Patent Reference 1 describes a method for manufacturing an electronic gun and a quantum wire and uses a structure where a sacrifice layer and an electrode layer are formed in an upper layer of a triangular section structure. This manufacturing method causes the apex of an electrode to protrude and removes the protruding part of the electrode to form a final electrode by applying a resist of a thick film and through etching-back. The electrode is formed over each of the side faces of the structure and the electrodes serve as input and output terminals.

By using a manufacturing method for fabricating, as described in [Patent Reference 1], fixed electrodes to be arranged over the side faces of an oscillator in a single layer, is made possible by simultaneously forming multiple fixed electrodes in an electrode layer formed with one process step.

[Non-patent Reference 1] M. Demirci, C. T.-C. Nguyen, "Higher-mode Free-Free Beam Micromechanical Resonators," Proceeding, 2003 IEEE Int. Frequency Control Symposium, Tampa, Fla., May 5-8, 2003, pp. 810-818.

[Patent Reference 1] JP-A-06-310029

A resonator of the vertical driving type described in Non-patent Reference 1 determines a resonance frequency of a selected vibration mode depending on the arrangement of fixed electrodes. In this configuration, the electrodes are formed only in a lower layer of an oscillator. Therefore, the electrodes are bounded in limited locations.

Patent Reference 1 uses a configuration where electrodes are arranged over the side faces of an oscillator and the electrodes are driven in parallel on a substrate. This approach solves the problem of Non-patent Reference 1. However, in Patent Reference 1, the height of an electrode arranged over each of the side faces of the structure is determined by the control time of resist etching-back in the manufacturing process, thus requiring sophisticated film thickness control in order to vary the electrode height. It is difficult to independently control the film thickness of multiple fixed electrodes. With this approach, it is necessary to have a multilayer electrode configuration. A multilayer configuration adds to the number of processes to complicate the manufacturing method with a rise in the manufacturing costs.

In case an electromechanical resonator of the parallel driving type is provided with the configuration of Patent Reference 1, it is necessary to remove the sacrifice layer in the lower layer of the oscillator to form released structure. FIG. 19 shows a cross section of this electromechanical resonator. A sacrifice layer 54 in the lower layer of an oscillator 56 is removed in FIG. 19. In case an electrode 55 is thin, the sacrifice layer 54 in the lower layer of the electrode 55 is simultaneously etched. As a result, undercutting may occur in the electrode. This results in problems that the electrode 55 is stuck and fixed to a substrate 57 and that the electrode 55 is excited with an input signal.

SUMMARY

An object of the invention is to provide an electromechanical resonator of the parallel driving type capable of varying variable the height of an electrode as required and maintaining the electrode strength.

In order to solve the problems, the invention provides an electromechanical resonator which includes a plurality of fixed electrodes formed in a single layer and an oscillator arranged between the fixed electrodes with gap. A part of the gap is larger than the another parts of the gap. In other words, the invention provides an electromechanical resonator comprising a resonator portion which includes a fixed electrode and an oscillator formed separately from the fixed electrode with a gap. The gap has a first gap region and a second gap region which are arranged in a thickness direction of the fixed electrode. The first gap region is different in width from the second gap region.

The thickness direction of the fixed electrode refers to the laminating direction of fixed electrodes and corresponds to the length direction of the gap. The length direction of the gap is perpendicular to the width direction of the gap. This allows free choice of a substantial gap width. It is thus possible to form an electromechanical resonator having a desired resonance frequency by solely adjusting the gap width. The fixed electrode can be formed without reducing its thickness. It is thus possible to maintain the strength of the fixed electrode. There is no such disadvantage described above that the electrode is stuck to a substrate or that the fixed electrode is excited with an input signal.

Preferably, a width of the first gap region is constant. The second gap region has a width enough for neglecting a capacitance between the fixed electrode and the oscillator.

With this configuration, only the first gap region is used as an operating region, as a result, the design for making the electromechanical resonator can be facilitated. Even in case a plurality of resonator portions having different resonance frequencies are formed on the same substrate, it is possible to change the size of the first gap region and change the resonance frequency only by adjusting the width of a groove or the like, thus allowing easy design work.

Preferably, the fixed electrode has a first fixed electrode and a second fixed electrode. The oscillator is arranged between the first fixed electrode and the second fixed electrode with the gaps.

Preferably, the gap has only an air gap.

Preferably, the gap has an air gap and a dielectric gap.

Preferably, the gap has only a dielectric gap.

Preferably, the oscillator is made of monocrystalline silicon.

Preferably, the oscillator is made of polysilicon.

Preferably, the fixed electrode is formed on a substrate via a predetermined supporting portion. Side faces of the oscillator are inclined with respect to a surface of the substrate.

Preferably, the fixed electrode is formed on a substrate via a predetermined supporting portion. Side faces of the oscillator are perpendicular to a surface of the substrate.

Preferably, a thickness of the fixed electrode is greater than that of the oscillator.

Preferably, a thickness of the fixed electrode is equal to that of the oscillator.

Preferably, a thickness of the fixed electrode is smaller than that of the oscillator.

Preferably, a plurality of the resonator portions have different resonance frequencies respectively which are formed on a substrate.

Preferably, the resonator portion includes a first resonator portion and a second resonator portion, each of which having the fixed electrode and the oscillator. The first gap region of the first resonator portion is different in the width from the first gap region of the second resonator portion.

The invention provides a method for manufacturing an electromechanical resonator, comprising: forming a first electrode on a substrate; forming an insulating film on the first electrode; forming a conductor layer on the insulating film and flattening the conductor layer to form a second electrode; and forming a gap between the first electrode and the second electrode. One of the first electrode and the second electrode is a fixed electrode, and the other of the first electrode and the second electrode is an oscillator. The gap has a first gap region and a second gap region which are arranged in a thickness direction of the fixed electrode. The first gap region is different in width from the second gap region. That is, the one of the fixed electrodes and the oscillator is patterned to form an insulating film serving as a sacrifice layer. The conductor layer serving as the other electrode is formed in an upper layer of the insulating film. Then the insulating film is removed to form a gap of a constant width and additionally a groove so as to form a gap of a width broader than that of the gap of a constant width. With this procedure, it is possible to readily form an electromechanical resonator having a gap width that varies in the direction of thickness. While generally an oscillator is patterned first, a fixed electrode may be patterned first.

The invention further includes processes of: forming an insulating film in an upper layer of an oscillator; forming a conductor layer in an upper layer of the insulating film and flattening the film; forming a mask pattern on the electrode layer and etching the layer in a direction normal to a substrate surface to form a groove; forming a protective film on the side face of the groove to selectively remove the conductor layer and form the pattern of a fixed electrode.

The invention also includes processes of: forming a groove on a substrate; forming a film on the groove; filling the groove with a conductor layer; and forming the groove reaching the insulating layer by etching the conductor layer in a slanting direction on the substrate.

With the above configuration, an electromechanical resonator adapting a plurality of resonance frequencies and having a fixed electrode of high strength is provided.

With the above manufacturing method, it is possible to form the fixed electrodes having plural resonance frequencies in the same layer thus reducing costs by way of simplified processes.

Preferably, the forming process of the gap includes: forming a groove on the conductor layer; and removing the insulating layer which is exposed from the groove to form an air gap.

Preferably, the forming process of the gap includes: doping impurities into the conductive layer to form a dielectric groove corresponding to the second gap region. A dielectric gap includes the second gap region and the first gap region which corresponds to the insulating film connected with the dielectric groove.

Preferably, the forming process of the gap includes: doping insulating impurities into the conductive layer to form a dielectric groove corresponding to the second gap region so that the dielectric groove connects with the first gap region having an air gap.

Preferably, the method further includes: etching the substrate to form the oscillator of a triangular section having an inclined surface, then forming an insulating layer on the oscillator; forming a conductor layer on the insulating layer; and etching the conductor layer in a vertical direction to form the groove reaching the insulating layer.

Preferably, the forming process of the gap includes: forming a groove on the substrate; forming the insulating layer on the groove, filling the groove with the conductor layer; and etching the conductor layer in slanting direction to form the groove reaching the insulating layer.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 12A to 12F show a process for manufacturing an electromechanical resonator according to the sixth embodiment;

DETAILED DESCRIPTION OF EXEMPLARY EMBODIMENTS

Embodiments of the invention will be described referring to drawings.

First Embodiment

Figure 1A:
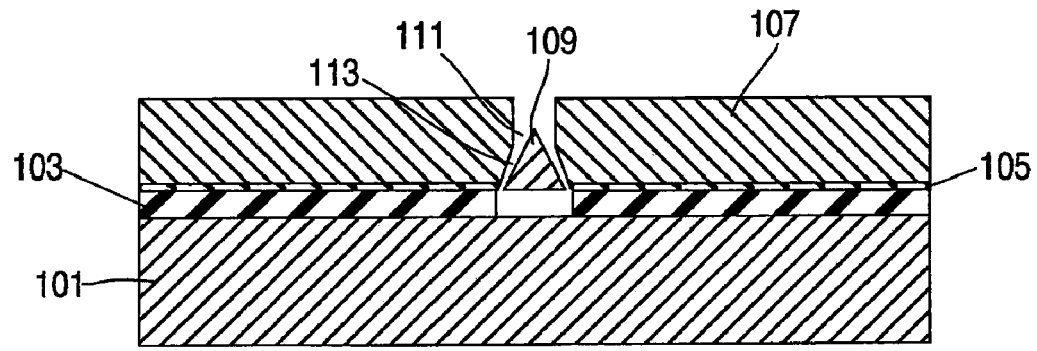
FIGS. 1A and 1B are cross-sectional views of an electromechanical resonator according to a first embodiment.
Figure 1B:
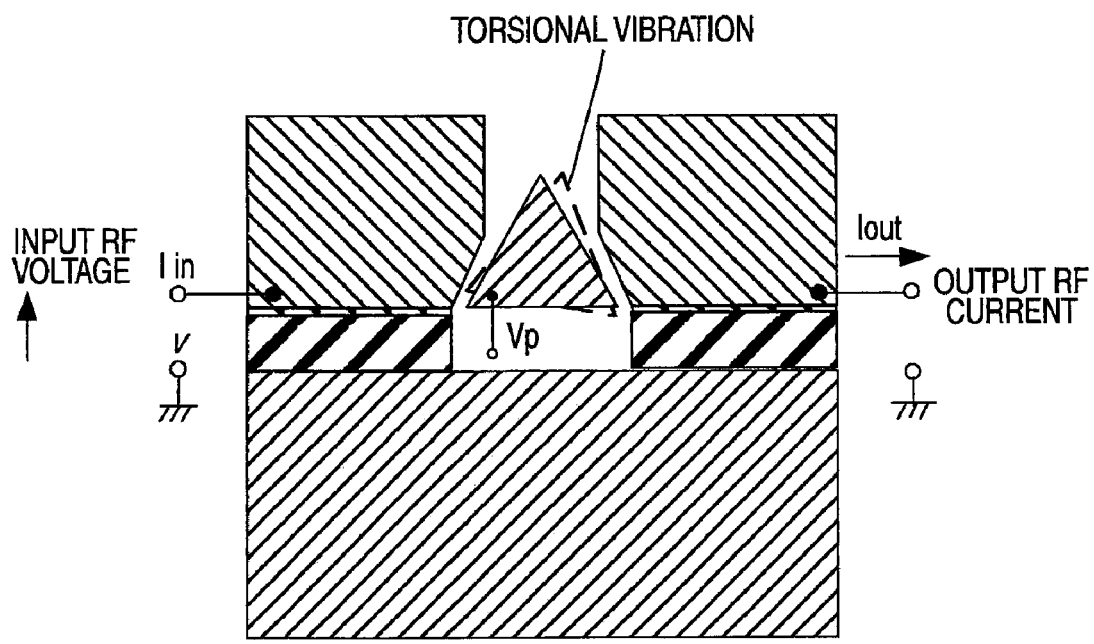
Figure 2A:
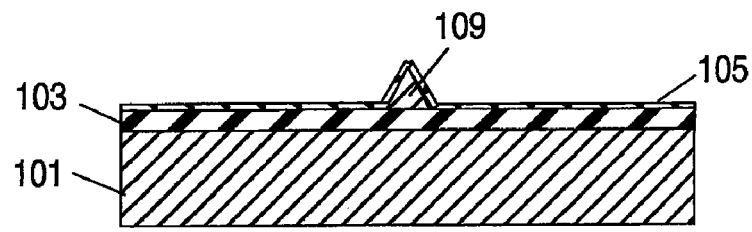
FIGS. 2A to 2D are cross-sectional views of a method for manufacturing an electromechanical resonator according to the first embodiment.
Figure 2B:
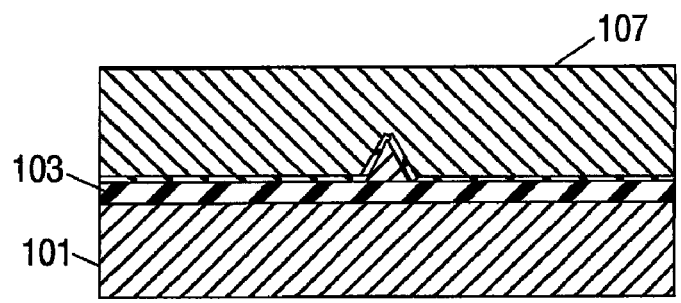

FIGS. 1A and 1B show an electromechanical resonator according to the first embodiment of the invention. FIGS. 2A and 2B show a method for manufacturing an electromechanical resonator according to the first embodiment.

As shown in FIG. 1A, the electromechanical resonator according to this embodiment includes a resonator portion having fixed electrodes and an oscillator 109 formed separately from the fixed electrodes 107 with gaps. Each of the gaps has a first region (113) with a constant width in a thickness direction of the fixed electrode 107 and a second region (111) being large enough for the capacitance between the fixed electrode and the oscillator to be negligible. The oscillator 109 is formed by a beam-shaped body of a triangular section. The fixed electrodes 107 are arranged over two side faces of the oscillator with air gaps, the air gaps between the oscillator 109 and the fixed electrodes 107 including a portion of a varying gap width (a nonconstant gap width). The thickness of the fixed electrode 107 is formed so as to be greater than that of the oscillator 109. To be precise, the air gap includes a gap 111 having a broad width and a gap 113 having a narrow width. A maximum electrostatic force is generated at the gap 113 having the narrow width in the air gap between the oscillator 109 and the fixed electrode 107. The electrostatic force exerted in the capacitance is proportional to the square of the width of the gap. A small electrostatic force is generated in the gap 111 having the broad width and a small driving force is obtained. FIG. 1B shows the mode of vibration excited by the gap spacing (gap width). In case the gap 113 having the narrow width overlaps half the thickness of the oscillator 109, a driving force is exerted in the region and, as a result, torsional vibration is excited with the beam of a triangular section working as an oscillator. Further, the thickness of the fixed electrode 107 is greater than that of the oscillator 109 thus enhancing the strength of the fixed electrode. To enhance the strength of the fixed electrode 107, the electrode film thickness is desirably set equal to or greater than the height of the structure of the electromechanical resonator.

FIGS. 2A to 2D show a method for manufacturing a resonator structure according to the first embodiment of the invention.

First, an SOI substrate, in which a monocrystalline silicon thin film is formed on a surface of a silicon substrate serving as a material substrate 101 via a silicon oxide layer serving as a first insulating film 103, is prepared.

Next, as shown in FIG. 2A, a mask pattern is formed by way of photolithography. Anisotropic etching is performed using the mask pattern, and an oscillator 109 in which a beam-shaped body of a triangular section having a slanted side face (with an inclination angle of 54.7 degrees) is formed. The silicon oxide film serving as the second insulating film 105 is formed on an upper layer of the oscillator 109.

As shown in FIG. 2B, a doped polycrystalline silicon layer as a fixed electrode 107 is formed on the second insulating film 105 by way of the CVD method. The depressurized CVD method or the like is desirably used in order to form a flat film.

Figure 2C:
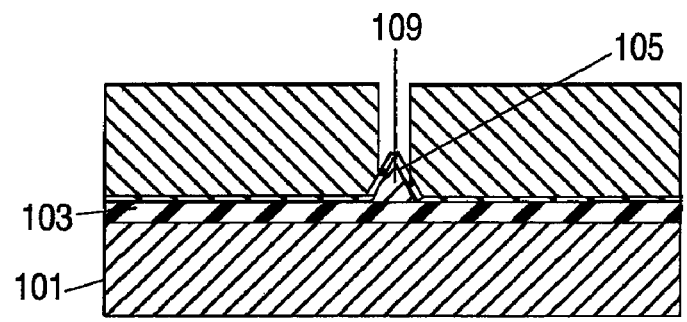

As shown in FIG. 2C, a mask pattern is formed and a groove is formed on the polycrystalline silicon layer working as the fixed electrode 107 to expose the second insulating film 105 formed in the upper layer of the oscillator 109.

Figure 2D:
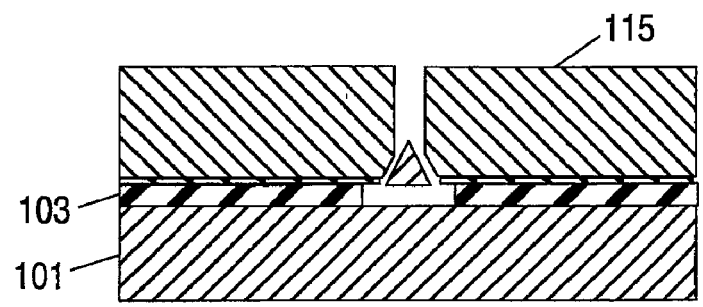

Finally, as shown in FIG. 2D, the second insulating film 105 to be exposed is removed by etching to form a gap and remove the first insulating film 103, thus forming an electromechanical resonator.

In this way, it is possible to form the electromechanical resonator shown in FIG. 1 with good workability.

In the first embodiment, the fixed electrode 107 is formed via the first insulating film 103 as a post on a substrate. By removing the portion corresponding to the post under the oscillator 109 by way of etching, the oscillator 109 may be selectively made movable.

The side face of the oscillator 109 is an inclined surface. In the first region, the fixed electrode 107 is opposed to the oscillator 109 with a gap having a predetermined spacing along the inclined surface of the oscillator 109 so as to exert an electrostatic force in the first region appropriately.

In the second region, the side face of the fixed electrode 107 is a perpendicular cross section separated to a large extent from the side face of the oscillator 109. In the second region, almost no electrostatic force is exerted.

The shape of each of these side faces may be changed as required, as long as there are arranged a first region of a constant gap width and formed narrow enough to cause an electrostatic force to be exerted and a second region having a gap width broad enough to neglect an electrostatic force.

In this embodiment, the beam-shaped body having a triangular section which serves as the oscillator 109 is formed of monocrystalline silicon. This material ensures shape machining with excellent control in the patterning of the oscillator 109 by way of anisotropic etching of silicon.

While an SOI substrate in which a monocrystalline silicon substrate is bonded on a silicon substrate is used as a material substrate of a starting material, an SOI substrate in which a polycrystalline silicon or amorphous silicon is bonded on the silicon substrate may be used instead. In such a case, there is no control to use anisotropic etching dependent on the monocrystalline surface as an etching end point.

Second Embodiment

The second embodiment of the invention will be described. While the gap is an air gap in the first embodiment, a capacitance insulating film 105 may be formed on the oscillator 109 or in the gap as a variation of the first embodiment.

Figure 3A:
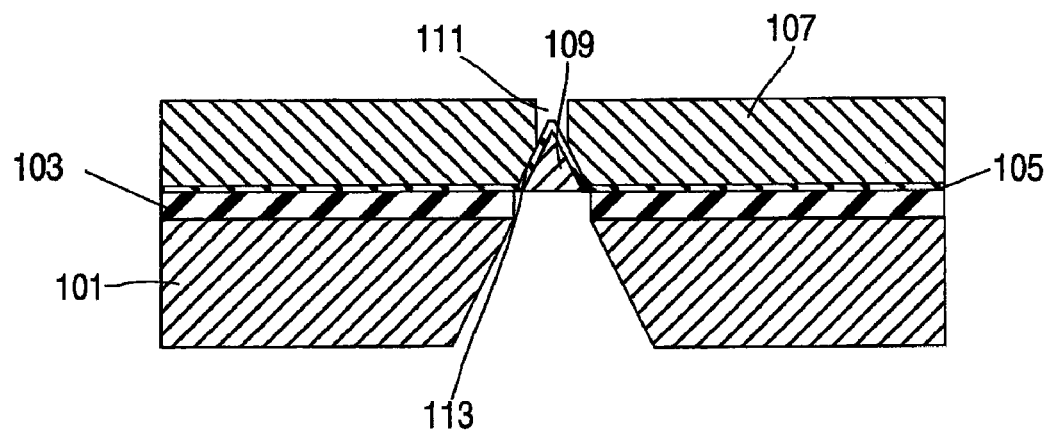
FIGS. 3A and 3B show an electromechanical resonator according to a second embodiment.
Figure 3B:
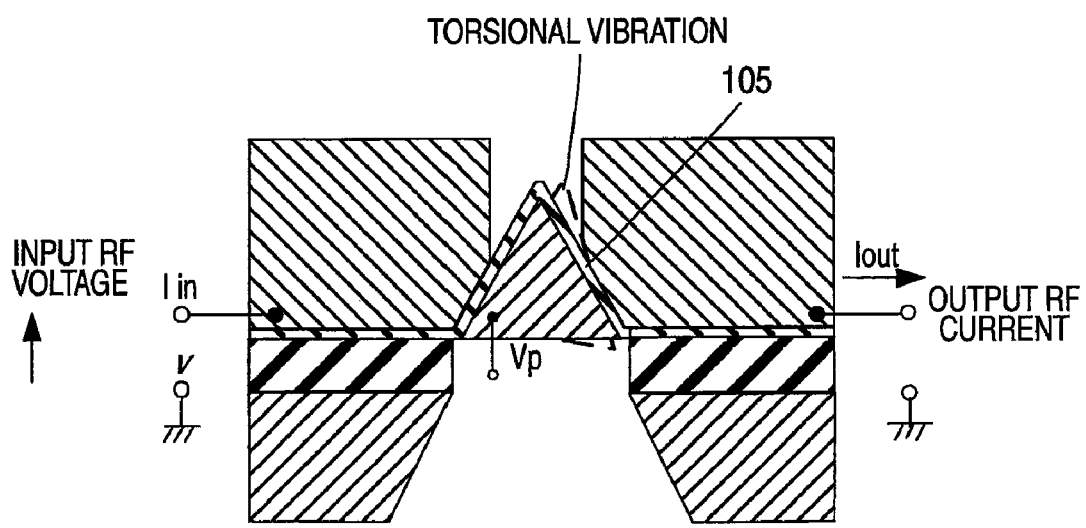

FIGS. 3A and 3B show variations of the electromechanical resonator according to the first embodiment shown in FIG. 1. In a configuration of the second embodiment, the capacitance ratio between a region having a broad gap and a region having a narrow gap is optimized by the capacitance insulating film 105 provided in the gap. FIG. 3B is an enlarged view of main parts of FIG. 3A.

As shown in FIGS. 3A and 3B, an electromechanical resonator according to the second embodiment is an electromechanical resonator of a capacitive coupling type for performing excitation and detection that uses, as a capacitance insulating film, the second insulating film 105 which is remained on the oscillator 109, instead of removing the second insulating film for forming the gap in the process of manufacturing the electromechanical resonator according to the first embodiment.

In this embodiment, the silicon substrate 101 is etched from the rear face thereof so as to facilitate vibration of the oscillator 109.

Third Embodiment

Figure 4A:
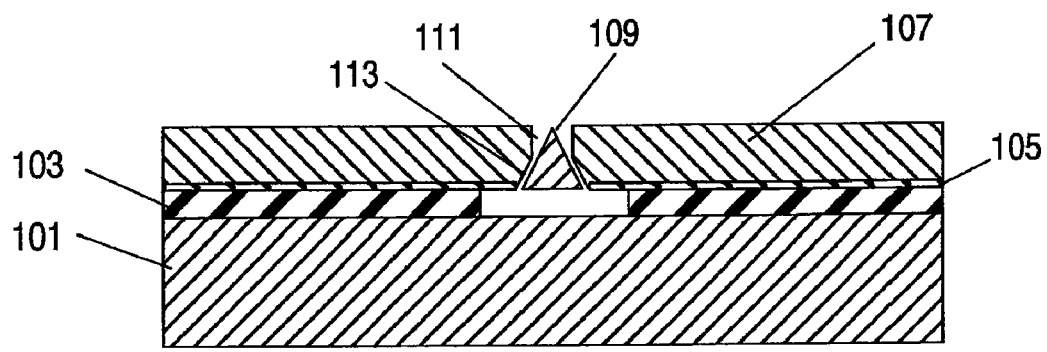
FIGS. 4A and 4B show an electromechanical resonator according to a third embodiment.
Figure 4B:
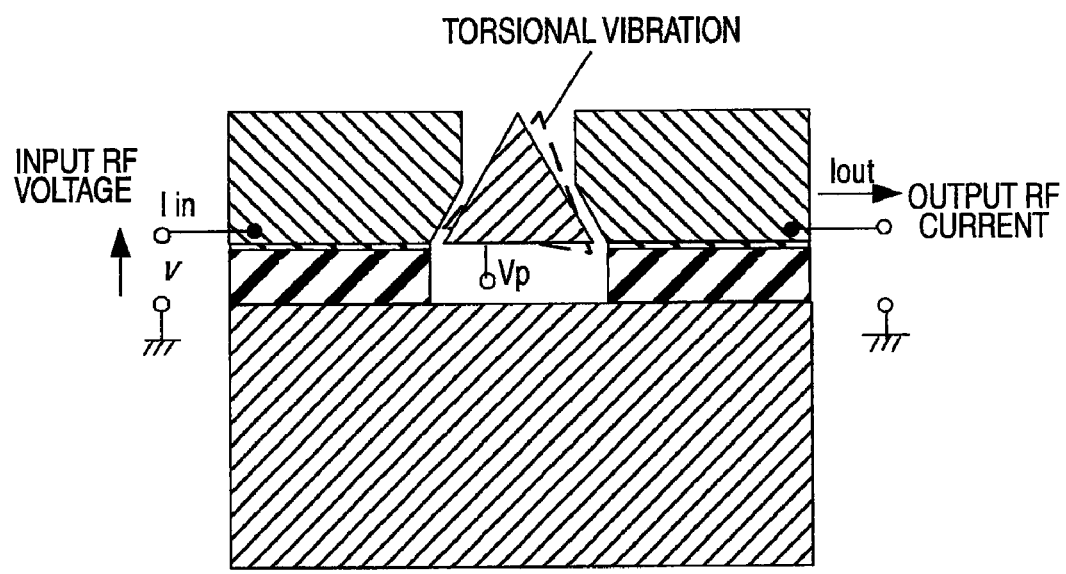

FIGS. 4A and 4B show an electromechanical resonator according to the third embodiment of the invention. FIGS. 5A to 5H are explanation views of a method for manufacturing the electromechanical resonator according to the third embodiment.

The electromechanical resonator according to the third embodiment differs from that of the first embodiment in that the thickness of the fixed electrode 107 is almost equal to that of the oscillator 109. In this configuration, the strength of the fixed electrode 107 of the third embodiment is smaller than that of the fixed electrode 107 of the first embodiment. However, the thickness of the fixed electrode 107 of this embodiment is utilized at a maximum.

As shown in FIG. 4A, the electromechanical resonator according to this embodiment includes a resonator portion having fixed electrodes and an oscillator 109 formed separately from the fixed electrodes 107 with gaps. Each of the gaps has a first region (113) with a constant width in a thickness direction of the fixed electrode 107 and a second region (111) being large enough for the capacitance between the fixed electrode and the oscillator to be negligible. The oscillator 109 is formed by a beam-shaped body of a triangular section. The fixed electrodes 107 are arranged over two side faces of the oscillator with air gaps, the air gaps between the oscillator 109 and the fixed electrodes 107 including a portion of a varying gap width (a nonconstant gap width). The thickness of the fixed electrode 107 is formed so as to be substantially equal to that of the oscillator 109. To be precise, the air gap includes a gap 111 having a broad width and a gap 113 having a narrow width. A maximum electrostatic force is generated at the gap 113 having the narrow width in the air gap between the oscillator 109 and the fixed electrode 107. The electrostatic force exerted in the capacitance is proportional to the square of the width of the gap. A small electrostatic force is generated in the gap 111 having the broad width and a small driving force is obtained. FIG. 4B shows the mode of vibration excited by the gap spacing (gap width). In case the gap 113 having the narrow width overlaps half the thickness of the oscillator 109, a driving force is exerted in the region and, as a result, torsional vibration is excited with the beam of a triangular section working as an oscillator. Further, the thickness of the fixed electrode 107 is substantially equal to that of the oscillator 109 thus taking maximum advantage of the height of the structure.

FIGS. 5A to 5H show a method for manufacturing the resonator structure according to the third embodiment of the invention. The manufacturing method in this embodiment differs from the manufacturing method described referring to FIG. 2 in the first embodiment in that the film thickness of the doped polycrystalline silicon layer for forming the fixed electrodes 107 is made larger and that a step of coating or covering the side wall of the doped polycrystalline silicon layer with a silicon nitride film 115 and performing etching-back up to the height of the oscillator 109 prior to the step of forming the gap is added.

The method for manufacturing the resonator structure according to the third embodiment will be described.

First, an SOI substrate, in which a monocrystalline silicon thin film is formed on a surface of a silicon substrate serving as a material substrate 101 via a silicon oxide layer serving as a first insulating film 103, is prepared.

Figure 5A:
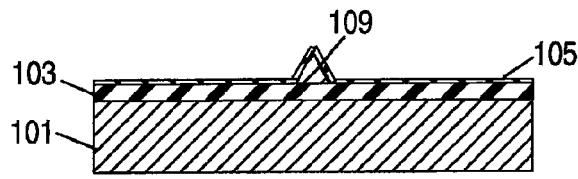
FIGS. 5A to 5H are cross-sectional views of a method for manufacturing an electromechanical resonator according to the third embodiment.

Next, as shown in FIG. 5A, a mask pattern is formed by way of photolithography. Anisotropic etching is performed using the mask pattern, and an oscillator 109 in which a beam-shaped body of a triangular section having a slanted side face (with an inclination angle of 54.7 degrees) is formed. The silicon oxide film serving as the second insulating film 105 is formed on an upper layer of the oscillator 109.

Figure 5B:
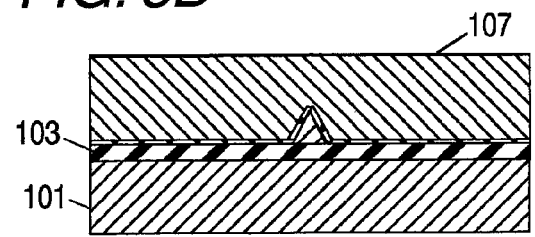

As shown in FIG. 5B, a doped polycrystalline silicon layer as a fixed electrode 107 is formed on the second insulating film 105 by way of the CVD method. The depressurized CVD method or the like is desirably used in order to form a flat film.

Figure 5E:
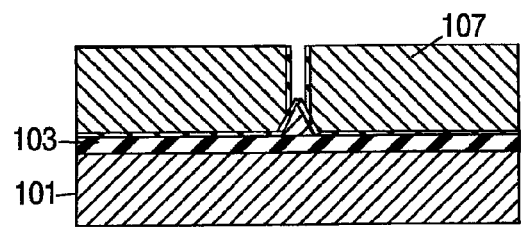
Figure 5C:
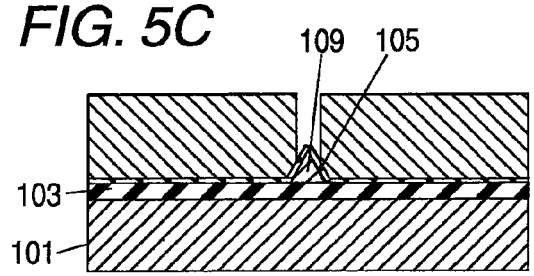

As shown in FIG. 5C, a mask pattern is formed and a groove is formed on the polycrystalline silicon layer working as the fixed electrode 107 to expose the second insulating film 105 formed in the upper layer of the oscillator 109.

Figure 5F:
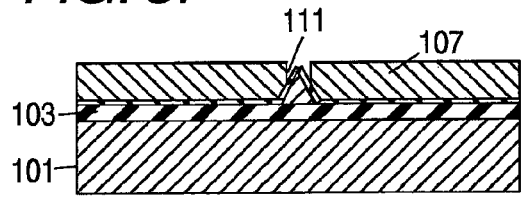
Figure 5D:
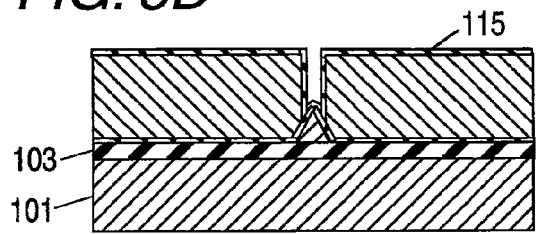
Figure 5G:
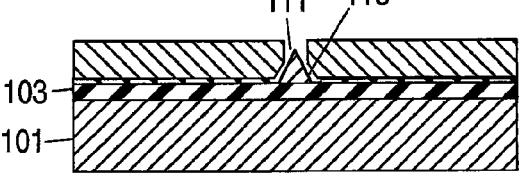

After that, a protective film 115 composed of a silicon nitride film is deposited (FIG. 5D) and anisotropic etching is carried out to remove the protective film 115 for an upper layer (FIG. 5E). As shown in FIG. 5F, a polycrystalline silicon layer for forming a fixed electrode 107 is etched to determine the film thickness of the polycrystalline silicon layer.

Figure 5H:
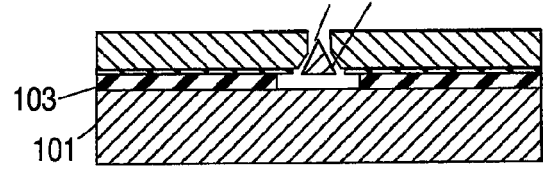

Finally, as shown in FIG. 2G, the second insulating film 105 to be exposed is removed by etching to form a gap and remove the first insulating film 103, thus forming an electromechanical resonator as shown in FIG. 5H.

In this way, it is possible to form the electromechanical resonator shown in FIG. 4 with good workability.

In the third embodiment, same as the first embodiment, the fixed electrode 107 is formed via the first insulating film 103 as a post on a substrate. By removing the portion corresponding to the post under the oscillator 109 by way of etching, the oscillator 109 may be selectively made movable.

The side face of the oscillator 109 is an inclined surface. In the first region, the fixed electrode 107 is opposed to the oscillator 109 with a gap having a predetermined spacing along the inclined surface of the oscillator 109 so as to exert an electrostatic force in the first region appropriately.

In the second region, the side face of the fixed electrode 107 is a perpendicular cross section separated to a large extent from the side face of the oscillator 109. In the second region, almost no electrostatic force is exerted.

The shape of each of these side faces may be changed as required, as long as there are arranged a first region of a constant gap width and formed narrow enough to cause an electrostatic force to be exerted and a second region having a gap width broad enough to neglect an electrostatic force.

In this embodiment, the beam-shaped body having a triangular section which serves as the oscillator 109 is formed of monocrystalline silicon. This material ensures shape machining with excellent control in the patterning of the oscillator 109 by way of anisotropic etching of silicon.

While an SOI substrate in which a monocrystalline silicon substrate is bonded on a silicon substrate is used as a material substrate of a starting material, an SOI substrate in which a polycrystalline silicon or amorphous silicon is bonded on the silicon substrate may be used instead. In such a case, there is no control to use anisotropic etching dependent on the monocrystalline surface as an etching end point.

Fourth Embodiment

The fourth embodiment of the invention will be described. While the gap is an air gap in the third embodiment, a capacitance insulating film is formed on the oscillator 109 or in the gap as a variation thereof.

Figure 6:
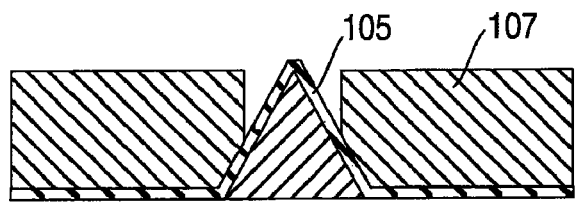
FIG. 6 shows an electromechanical resonator according to a fourth embodiment.
Figure 7:
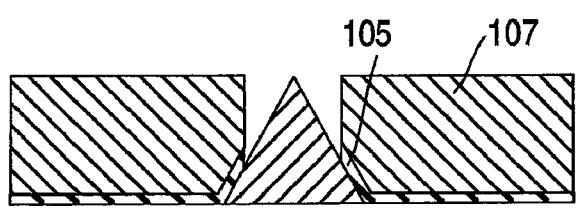
FIG. 7 shows an electromechanical resonator according to the fourth embodiment.

FIGS. 6 and 7 show variations of the electromechanical resonator according to the third embodiment shown in FIG. 4. In a configuration of the fourth embodiment, the capacitance ratio between a region having a broad gap and a region having a small gap is optimized by the capacitance insulating film 105 provided in the gap and a shape of the gap, as similar to the second embodiment.

As shown in FIG. 6, an electromechanical resonator according to this embodiment is an electromechanical resonator of a capacitive coupling type for performing excitation and detection that uses, as a capacitance insulating film, the second insulating film 105 which is remained on the oscillator 109, instead of removing the second insulating film for forming the gap in the process of manufacturing the electromechanical resonator according to the third embodiment.

In general, an expression for calculating a capacitance is as follows:

$$C = \frac{e \times S}{d} = \frac{e_0 \times e_r \times S}{d} [F] \qquad [\text{Expression 1}]$$

$e_o$=Dielectric constant of vacuum=8.854 E-12 F/m
$e_r$=Relative dielectric constant of an insulating film
d=distance between electrodes
s=Capacitor area While the relative dielectric constant ($e_r$) of air is approximately 1, that of an oxide film ($SiO_2$) is approximately 4.5 and that of a nitride film ($Si_3N_4$) is approximately 7.5.

In FIG. 7, the insulating film 105 in the air gap region is removed so as to gain a more capacitance variation ratio than in FIG. 6.

Figure 8A:
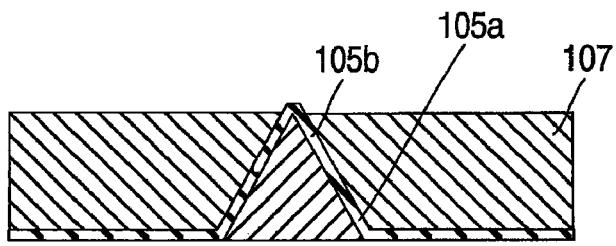
FIGS. 8A and 8B shows variations of the electromechanical resonator according to the fourth embodiment.

Further, as shown in the variation in FIG. 8A, a dielectric gap may be formed of materials having different relative dielectric constants with a geometric gap width unchanged. To be more precise, the second insulating film 105 may be formed of a first dielectric 105a having a high dielectric constant and a second dielectric 105b such as silicon oxide to provide a first dielectric gap and a second dielectric gap. The dielectric gaps 105a, 105b can assure a high capacitance ratio (20-60) without changing the gap width and substantially operate the same way as a gap width ratio of 20 or more, thus offering an optimum configuration when the dielectric gaps include a first region composed of silicon oxide or the like and a second region composed of hafnium oxide $HFO_2$ ($e_r$=80), titanium oxide $TiO_2$ ($e_r$=80), BST, $BaSrTiO_3$ ($e_r$=300) or the like serving as a ferroelectric layer assure a high capacitance ratio (20-60).

Figure 8B:
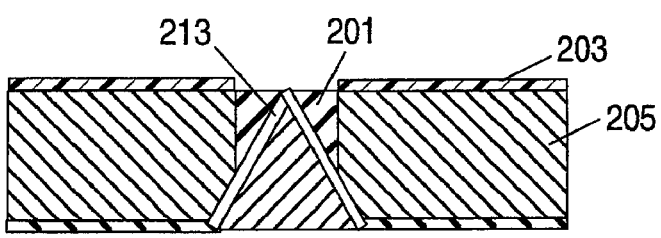

Also, as shown in the variation in FIG. 8B, an insulating impurities is doped into a part of the conductive layer 205 communicating with an air gap 213 so that the part of the conductive layer 205 is turned into a dielectric part 201 to form the second region constructed by a dielectric gap 201. As a result, a gap constructed by the air gap 213 and the dielectric gap 201 is formed.

Fifth Embodiment

The fifth embodiment of the invention will be described.

The process of manufacturing an electromechanical resonator according to the fifth embodiment is shown in FIGS. 9A to 9D. In this embodiment, a nondoped polycrystalline silicon layer is used instead of the broad gap 111 in the second region. The fixed electrode 205 is made of a heavily doped polycrystalline silicon layer and more distance is substantially provided between the oscillator 109 and the fixed electrode 205, thus delivering the same working effect as a broad gap. In the manufacture of the electromechanical resonator, for example, ion implantation at a high dose may be made into the polysilicon 201 prior to doping except in some regions so as to control the coupling area (capacitive coupling area).

In the manufacture, same as the first embodiment shown in FIG. 5A, an SOI substrate, in which a monocrystalline silicon thin film is formed on a surface of a silicon substrate serving as a material substrate 101 via a silicon oxide layer serving as a first insulating film 103, is prepared. Next, a mask pattern is formed by way of photolithography. Anisotropic etching is performed using the mask pattern, and an oscillator 109 in which a beam-shaped body of a triangular section having a slanted side face with an inclination angle of 54.7 degrees is formed. The silicon oxide film serving as the second insulating film 105 is formed on an upper layer of the oscillator 109.

Figure 9A:
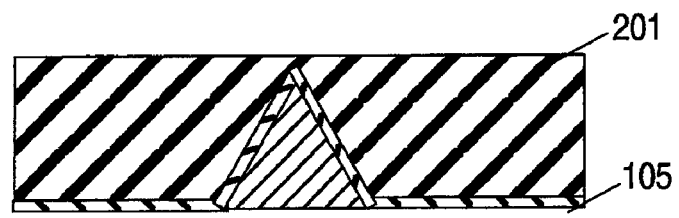
FIGS. 9A to 9D show an electromechanical resonator according to a fifth embodiment.

As shown in FIG. 9A, a nondoped polycrystalline silicon layer 201 as a fixed electrode is formed on the second insulating film 105 by way of the CVD method. The depressurized CVD method or the like is desirably used in order to form a flat film.

Figure 9B:
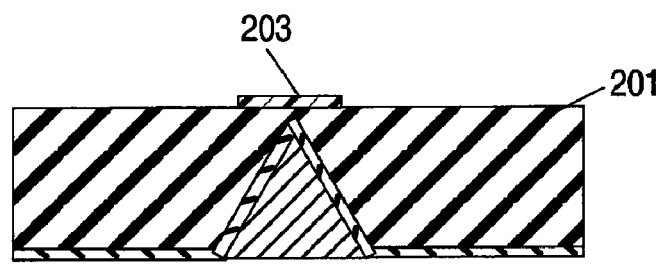

Next, as shown in FIG. 9B, a mask 203 is formed in a region where a broad gap is to be formed and the polycrystalline silicon layer 201 of a region where a fixed electrode is to be formed is exposed.

Figure 9C:
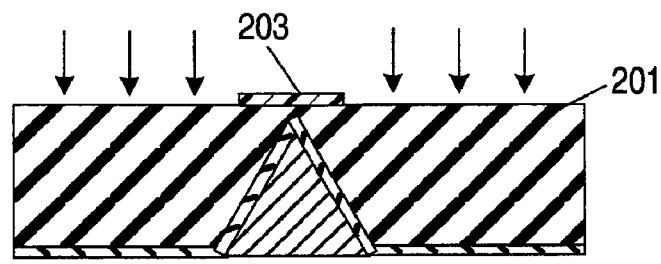
Figure 9D:
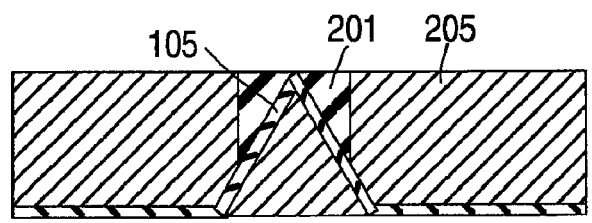

After that, ion implantation is made in a state that the mask 203 is remained (FIG. 9C). As shown in FIG. 9D, the polycrystalline silicon layer in the region to be exposed from the mask is heavily doped to form a fixed electrode 205. The region covered with the mask 203 without being doped remains as a nondoped polycrystalline silicon layer which works as a dielectric gap 201.

In this way, it is possible to form the electromechanical resonator with good workability.

In the first embodiment, a fixed electrode is formed via the first insulating film 103 as a post on a substrate. By removing the portion corresponding to the post under the oscillator 109 by way of etching, the oscillator 109 may be selectively made movable. Similar way for removing the first insulating film 103 provided under the oscillator 109 may be applied to the electromechanical resonator according to the fifth embodiment.

The insulating film 105 as a sacrifice layer may be removed to form an air gap or the insulating film 105 may be left without being removed for an electrostatic force to be exerted.

Either choice may be made to provide an electromechanical resonator of a capacitive coupling type.

Figure 10A:
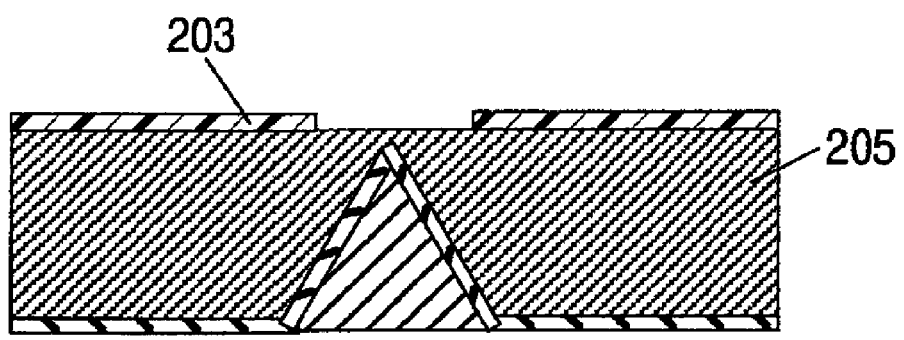
FIGS. 10A and 10B show a process for manufacturing an electromechanical resonator according to the fifth embodiment.
Figure 10B:
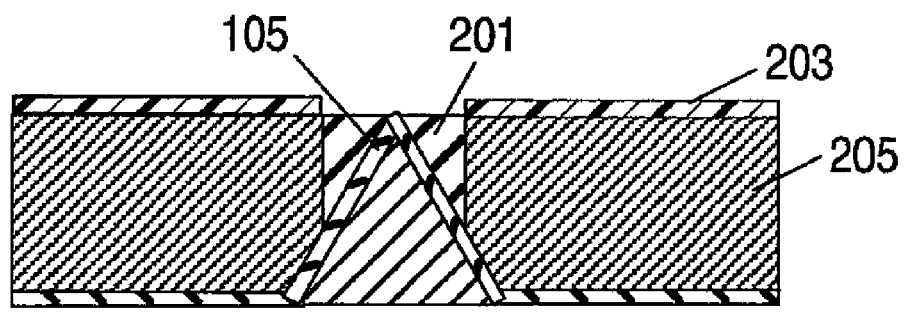

In the process of forming a gap, whose manufacturing process is shown in part in FIGS. 10A and 10B, insulating impurities may be doped into a doped polycrystalline silicon layer 205 as a fixed electrode and turning the doped polycrystalline silicon layer into a dielectric to form a second region 201 composed of a dielectric groove, and an insulating film in a region communicating with the dielectric groove may be used as a first region to form a dielectric gap.

With this configuration, it is possible to readily form the second region including a broad dielectric gap only by doping insulating impurities in a state that the mask is remained.

The process of forming the gap may include a process of doping insulating impurities into the electrode which communicates with an air gap after removing the insulting film to form the air gap, and turning the electrode into a dielectric thus forming a second region composed of a dielectric groove in order to form a gap composed of the air gap and dielectric gap.

With this configuration, it is possible to remove a portion of a sacrifice layer to provide an air gap and turn a portion of the air gap into a dielectric gap.

The method for manufacturing an electromechanical resonator according to this embodiment includes steps of: performing etching to provide an inclined surface and form an oscillator of a triangular section, then forming a insulating layer in an upper layer of the oscillator; forming a conductor layer in an upper layer of the insulating layer; and etching the conductor layer in vertical direction to form the groove reaching the insulating layer.

As a result, the groove reaching the insulating layer is readily formed into a broad air gap. By removing the insulating layer, it is possible to provide an air gap of a constant width.

The method for manufacturing an electromechanical resonator according to this embodiment may include steps of: forming a groove on a material substrate; forming an insulating film on the groove, filling the groove with a conductor layer; and forming a mask pattern and etching the conductor layer in the slanting direction of the substrate.

With this approach, it is possible to readily form a broad air gap. The step of filling the groove with a conductor layer is readily made possible by forming a groove and then an insulating film, forming a conductor layer, and flattening the layer through etching-back or CSP. In this example, the conductor layer filled into the groove constitutes an oscillator or a fixed electrode.

Sixth Embodiment

The sixth embodiment of the invention will be described. While a single resonator portion is arranged on a substrate in the third embodiment, plural different resonator portions are arranged on a substrate in the sixth embodiment.

Figure 11:
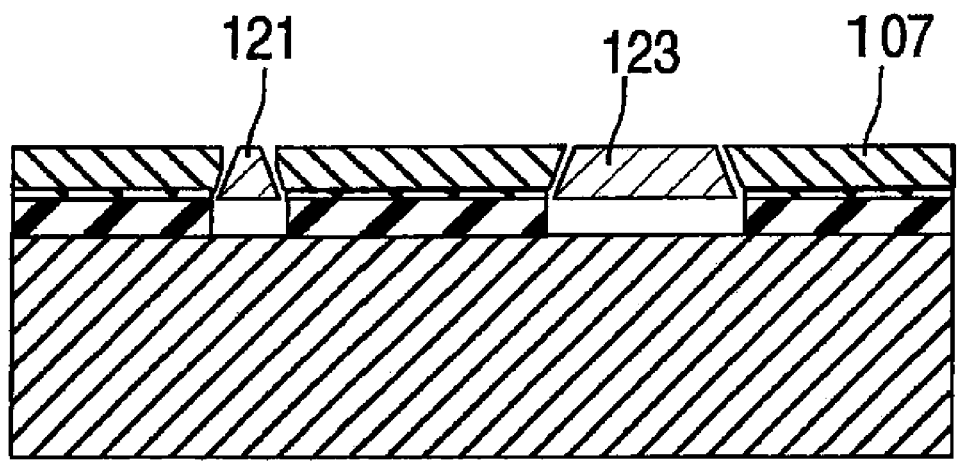
FIG. 11 shows an electromechanical resonator according to a sixth embodiment.

FIG. 11 shows an electromechanical resonator according to the sixth embodiment. FIG. 12 is a cross-sectional view for explaining a method for manufacturing an electromechanical resonator according to the sixth embodiment.

FIG. 11 is an as-built drawing of the electromechanical resonator including the plural electromechanical resonators having different resonance frequencies on the single substrate. A numeral 121 represents a first oscillator having a beam of a trapezoidal section. A numeral 123 represents a second oscillator of a large-sized rectangular shape. Fixed electrodes 107 are formed in the same layer. The gap formed between the second oscillator 123 and the fixed electrode 107 has a constant width. The gap formed between the first oscillator 121 and the fixed electrode 107 includes a first region having a constant gap width and a second region having a broad gap width, same as the first embodiment. In the second region, a region where the gap between the oscillator 121 and the electrode 107 is broader.

With this configuration, the first oscillator 121 and the second oscillator 123 are excited in different vibration modes and have different resonance frequencies. It is thus possible to readily provide an electromechanical resonator supporting a plurality of frequencies.

While two resonators having different resonance frequencies are arranged side by side in this embodiment, the overlap region of a constant gap width occurring between a fixed electrode and an oscillator formed in the same layer can be arbitrarily changed, so that three or more electromechanical resonators may be arranged.

A method for manufacturing an electromechanical resonator according to the sixth embodiment of the invention is shown in FIG. 12A to 12F. The manufacturing method may be implemented by the same process as that in the first embodiment shown in FIGS. 2A to 2D only except that a different photo mask is used for patterning an oscillator, so that the corresponding description is omitted. The sixth embodiment differs from the first embodiment in that beams of a trapezoidal section 121, 123 are formed instead of the beam of a triangular section 109 shown in the third embodiment.

Seventh Embodiment

Figure 13:
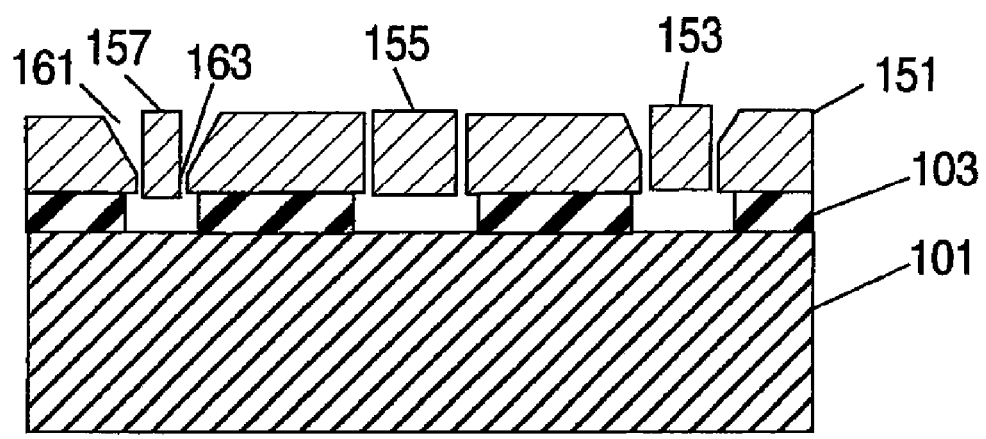
FIG. 13 shows an electromechanical resonator according to a seventh embodiment.

FIG. 13 shows an electromechanical resonator according to the seventh embodiment of the invention. FIG. 14 is a cross-sectional view for explaining a method for manufacturing the electromechanical resonator according to the seventh embodiment.

While a beam of a triangular section is used as an oscillator and a gap is formed on a slanting surface in the first to fourth embodiments, the side faces of the oscillators 153, 155, 157 are perpendicular to the substrate surface and the end face of the fixed electrode 151 is made into a tapered section for a region where a broad gap is to be formed in this embodiment. Except for the above difference, the electromechanical resonator provided in this embodiment is the same as that of the sixth embodiment.

In this embodiment, an electromechanical resonator is shown where a groove 171 is formed on a polycrystalline silicon layer (conductor layer) 151 which is formed on the silicon substrate 101 via a first insulating film 103 to form oscillators of a rectangular section 153, 155, 157. To arrange a fixed electrode 151 that is optimum for the resonance frequency of the resonator with respect to these oscillators, an electrode using an inclination having gaps of a broad width and a narrow width.

Figure 14A:
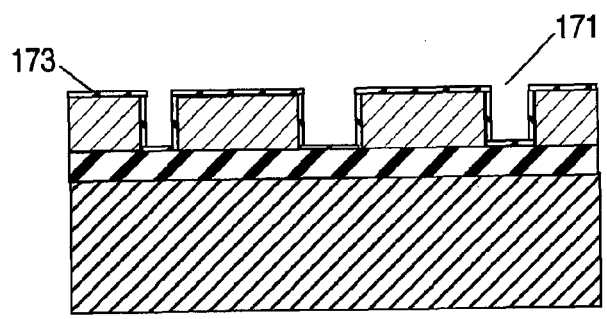
FIGS. 14A to 14E show a process for manufacturing an electromechanical resonator according to a seventh embodiment.

A method for manufacturing the electromechanical resonator according to the seventh embodiment is shown in FIG. 14A to 14E. In FIG. 14A, same as the first embodiment, an SOI substrate is used as a starting material and the groove 171 is formed on the polycrystalline silicon layer 151 to form a first protective film 173 made of silicon nitride.

Figure 14B:
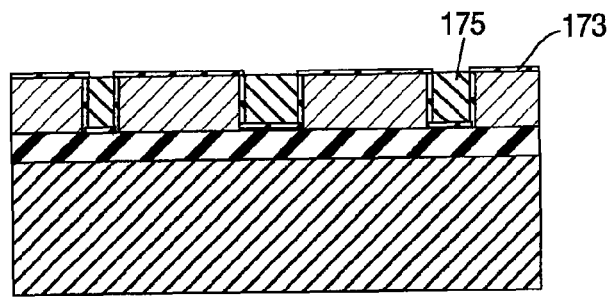

Next, as shown in FIG. 14B, the polycrystalline silicon layer (conductive layer) 175 as an oscillator is deposited and a surface layer is removed by way of etching-back.

Figure 14C:
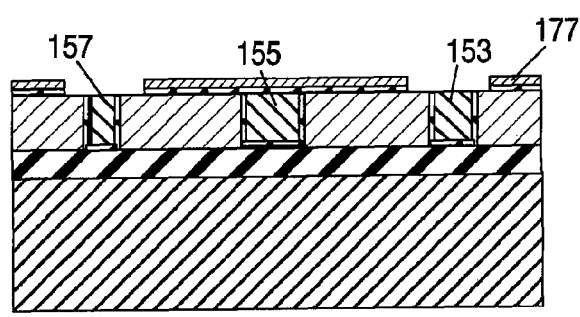

After that, as shown in FIG. 14C, a second protective film 177 composed of a silicon nitride film is formed and patterned through photolithography.

Figure 14D:
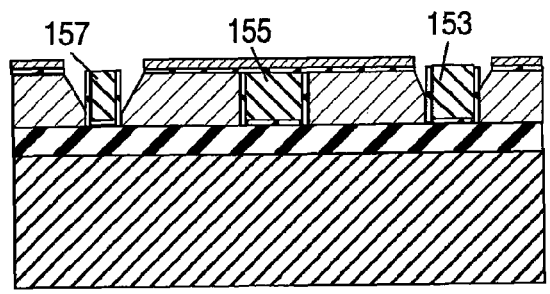
Figure 14E:
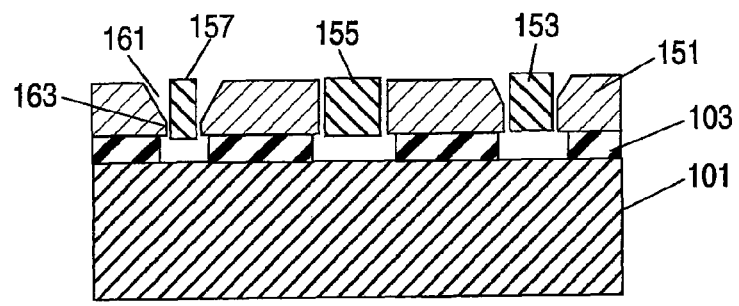

Etching is made using the second protective film 177 as a mask. In this process, a positive tapered cross-sectional shape is formed. This is readily attained for example by a process of ion beam etching (IBE) or crystal anisotropy etching (FIG. 14D).

Finally, the first protective film 173 and the first insulating film 103 are removed to separate the oscillator 153 from the substrate 101.

In this way, an electromechanical resonator including a first region 163 of a narrow gap width and a second region 161 of a broad gap width is formed.

The first and second protective films used in this example are of any material as an etching mask and are not limited to an insulating material. In case the first protective film 173 is not removed but left as a dielectric gap, a dielectric film of a desired dielectric constant should be used.

Eighth Embodiment

The eighth embodiment of the invention will be described. While the plural different resonator portions are arranged on the substrate in the sixth embodiment, a fixed electrode has a thickness larger than that of an oscillator constituting a resonator in a similar structure in this embodiment.

FIGS. 15A to 15D are cross-sectional views for explaining a method for manufacturing an electromechanical resonator according to the eighth embodiment.

Figure 15A:
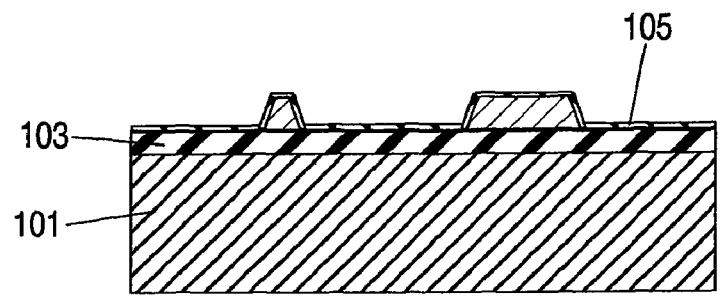
FIGS. 15A to 15D show a process for manufacturing an electromechanical resonator according to a eighth embodiment.
Figure 15B:
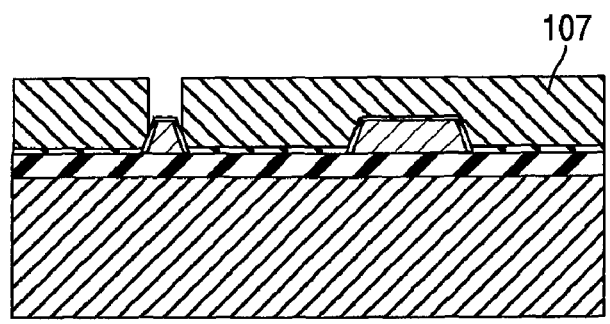
Figure 15C:
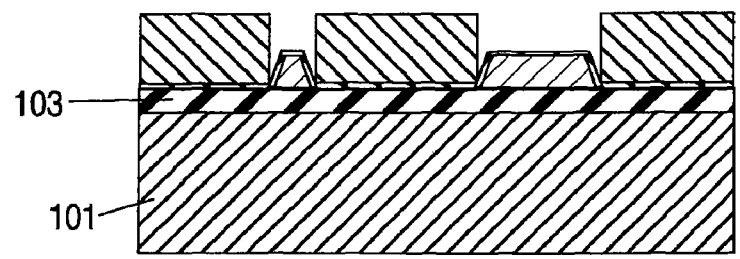
Figure 15D:
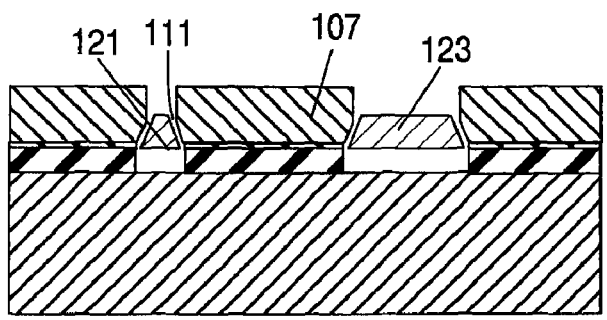

FIG. 15D is an as-built drawing of the electromechanical resonator including plural electromechanical resonators having different resonance frequencies on a single substrate. A numeral 121 represents a first oscillator having a beam of a trapezoidal section. A numeral 123 represents a second oscillator of a large-sized rectangular shape. Fixed electrodes 107 are formed in the same layer. The gap formed between the second oscillator 123 and the fixed electrode 107 has a constant width. The gap formed between the first oscillator 121 and the fixed electrode 107 includes a first region having a constant gap width and a second region having a broad gap width, same as the first embodiment. In the second region, a region where the gap between the oscillator 121 and the electrode 107 is broader.

With this configuration, the first oscillator 121 and the second oscillator 123 are excited in different vibration modes and have different resonance frequencies. It is thus possible to readily provide an electromechanical resonator supporting a plurality of frequencies.

While two resonators having different resonance frequencies are arranged side by side in this embodiment, the overlap region of a constant gap width occurring between a fixed electrode and an oscillator formed in the same layer can be arbitrarily changed, so that three or more electromechanical resonators may be arranged.

A method for manufacturing an electromechanical resonator according to the eighth embodiment of the invention is shown in FIG. 15A to 15D. The manufacturing method may be implemented by the same process as that in the first embodiment shown in FIGS. 2A to 2D only except that a different photo mask is used for patterning an oscillator, so that the corresponding description is omitted. The eighth embodiment differs from the first embodiment in that beams of a trapezoidal section 121, 123 are formed instead of the beam of a triangular section 109 shown in the first embodiment.

Ninth Embodiment

Figure 16:
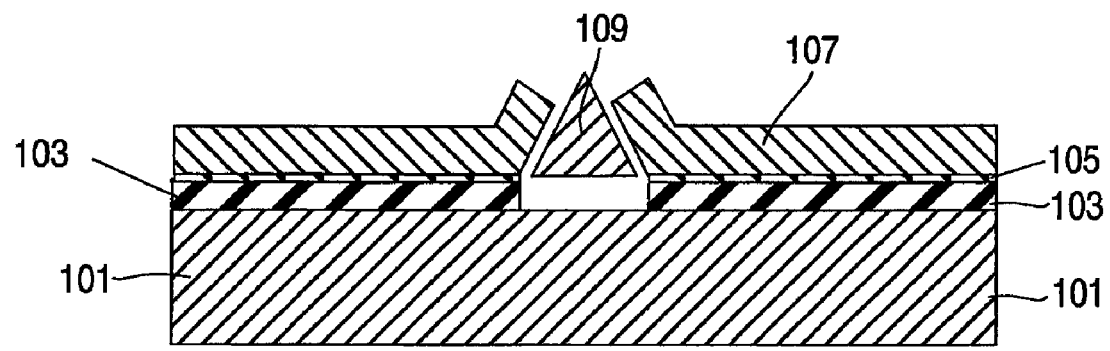
FIG. 16 shows an electromechanical resonator according to a ninth embodiment.

FIG. 16 shows an electromechanical resonator according to the ninth embodiment of the invention. FIGS. 17A to 17E are cross-sectional views for explaining a method for manufacturing an electromechanical resonator according to the ninth embodiment.

While the thickness of the fixed electrode 107 is approximately equal to that of an oscillator in the first embodiment, the thickness of the fixed electrode 107 is smaller than that of an oscillator in the electromechanical resonator according to this embodiment.

As shown in FIG. 16, the electromechanical resonator according to this embodiment includes a resonator portion which has fixed electrodes 107 and an oscillator 109 formed separately from the fixed electrodes 107 with gaps. The electromechanical resonator includes a first region with a gap of a constant width from the fixed electrode 107 in the direction of the thickness of the oscillator, with the thickness of the fixed electrode 107 being smaller than that of the oscillator 109, and a second region large enough for the capacitance between the fixed electrode and the oscillator to be negligible since a fixed electrode being absent. The oscillator 109 forms a beam-shaped body of a triangular section. The fixed electrodes 107 are arranged up to a predetermined height of the two side faces of this oscillator, a portion of the oscillator 109 is an air gap including a portion where the fixed electrodes 107 are not opposed to each other. To be precise, the air gap includes a gap 111 having a broad width and a gap 113 of a narrow width. Between the oscillator 109 and the fixed electrode 107, a maximum electrostatic force is generated in the gap 113 of a narrow width. The electrostatic force exerted between capacitors is proportional to the square of the width of the gap. Almost no electrostatic force is generated in a gap 111 having a broad width and a small driving force is obtained.

FIGS. 17A to 17E show a method for manufacturing a resonator structure according to the ninth embodiment of the invention.

First, an SOI substrate, in which a monocrystalline silicon thin film is formed on a surface of a silicon substrate serving as a material substrate 101 via a silicon oxide layer serving as a first insulating film 103, is prepared.

Next, a mask pattern is formed by way of photolithography. Anisotropic etching is performed using the mask pattern, and an oscillator 109 in which a beam-shaped body of a triangular section having a slanted side face (with an inclination angle of 54.7 degrees) is formed. The silicon oxide film serving as the second insulating film 105 is formed on an upper layer of the oscillator 109.

Figure 17A:
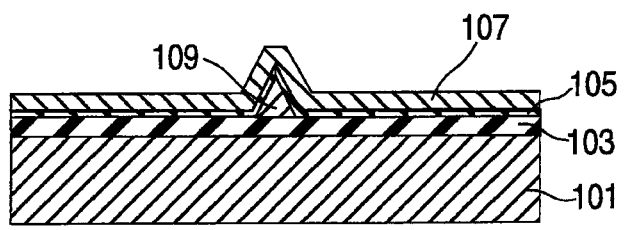
FIGS. 17A to 17E show a process for manufacturing an electromechanical resonator according to the ninth embodiment.

As shown in FIG. 17A, a doped polycrystalline silicon layer as a fixed electrode 107 is formed on the second insulating film 105 by way of the CVD method. The depressurized CVD method or the like is desirably used in order to form a flat film on a stepped portion.

Figure 17B:
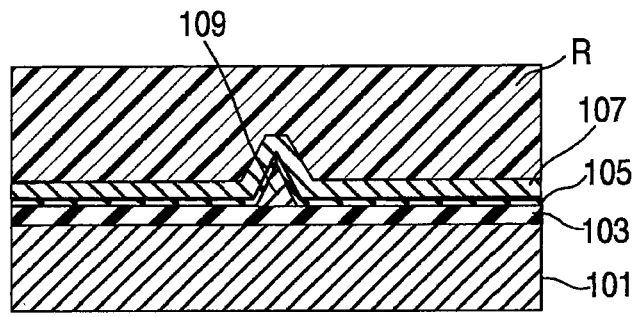

As shown in FIG. 17B, a resist R is applied to a doped polycrystalline silicon layer as a fixed electrode 107.

Figure 17C:
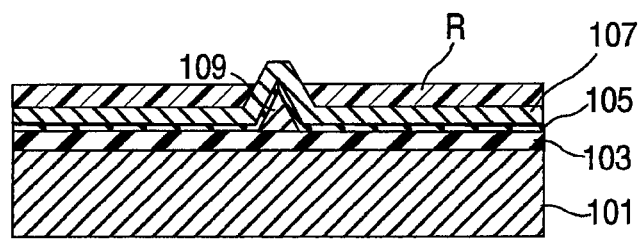

As shown in FIG. 17C, the resist is removed to a predetermined depth by way of the resist etching-back method so as to cause the doped polycrystalline silicon layer as a fixed electrode 107 to be exposed only at the apex of the surface of the oscillator.

Figure 17D:
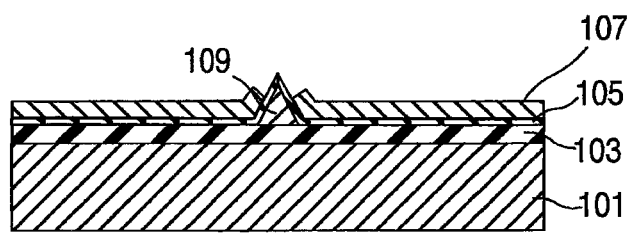
Figure 17E:
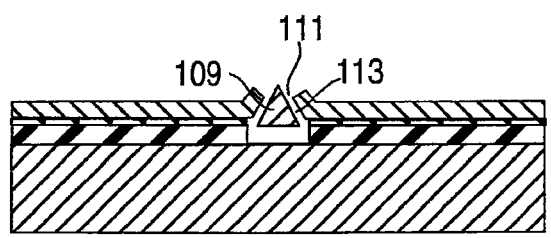
Figure 18A:
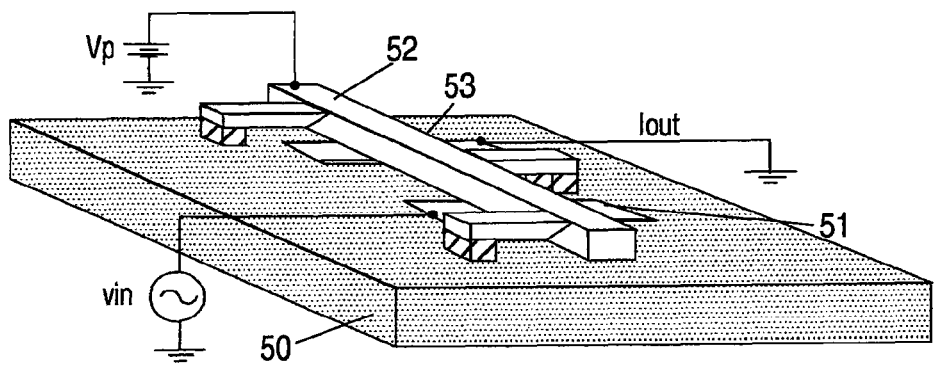
FIG. 18 shows an electromechanical resonator according to the related art.
Figure 18B:
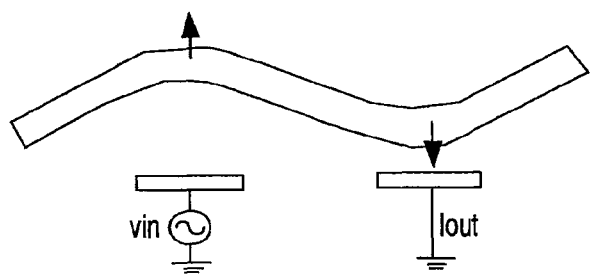
Figure 19:
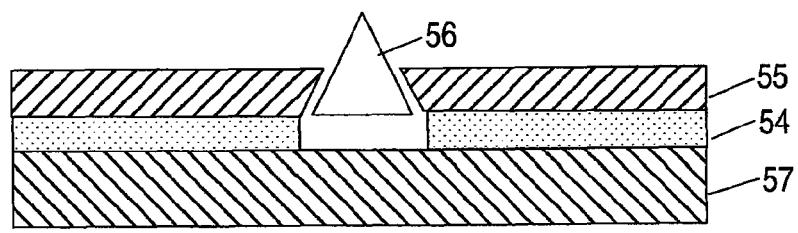
FIG. 19 shows an electromechanical resonator according to the related art.

Next, as shown in FIG. 17D, the doped polycrystalline silicon layer is removed by using the resist R as a mask.

Finally, as shown in FIG. 17D, the second insulating film 105 to be exposed is removed by etching to form a gap and remove the first insulating film 103, thus forming an electromechanical resonator.

In this way, it is possible to form the electromechanical resonator shown in FIG. 16 with good workability.

In the ninth embodiment, the fixed electrode 107 is formed via the first insulating film 103 as a post on a substrate. The thickness of the fixed electrode opposed to the oscillator 109 is reduced and the fixed electrode is formed along the side wall of the oscillator to form an electrostatic generation area having a desired width.

Since the thickness of the fixed electrode is thinner than that of the oscillator, the strength is decreased, but the opposed area is easily determined by changing the mask.

The invention provides an electromechanical resonator supporting a plurality of resonance frequencies and including input and output terminals with high mechanical strength that can be formed in the same layer. The electromechanical resonator provides a compact design and reduces manufacturing costs by way of simplified processes, so that is applicable to communication devices including portable terminals.

What is claimed is:

1. An electromechanical resonator, comprising:
    a resonator portion which includes a fixed electrode, an oscillator formed separately from the fixed electrode, and a gap between the fixed electrode and the oscillator,
    wherein the gap is vertically divided into a first gap region and a second gap region;
    wherein widths of the first gap region and the second gap region measured at two different heights from the bottom face of the fixed electrode are different; and
    wherein the oscillator has slanted side faces with an inclination angle of less than 90 degrees.

2. The electromechanical resonator according to claim 1, wherein a width of the first gap region is constant; and
    wherein a width of the second gap region is greater toward a top face of the fixed electrode.

3. The electromechanical resonator according to claim 1, wherein the fixed electrode has a first fixed electrode and a second fixed electrode; and
    wherein the oscillator is arranged between the first fixed electrode and the second fixed electrode with the gaps.

4. The electromechanical resonator according to claim 1, wherein the gap has only an air gap.

5. The electromechanical resonator according to claim 1, wherein the gap has an air gap and a dielectric gap.

6. The electromechanical resonator according to claim 1, wherein the gap has only a dielectric gap.

7. The electromechanical resonator according to claim 1, wherein the oscillator is made of monocrystalline silicon.

8. The electromechanical resonator according to claim 1, wherein the oscillator is made of polysilicon.

9. The electromechanical resonator according to claim 1, wherein the fixed electrode is formed on a substrate via a predetermined supporting portion.

10. The electromechanical resonator according to claim 1, wherein a thickness of the fixed electrode is greater than that of the oscillator.

11. The electromechanical resonator according to claim 1, wherein a thickness of the fixed electrode is equal to that of the oscillator.

12. The electromechanical resonator according to claim 1, wherein a thickness of the fixed electrode is smaller than that of the oscillator.

13. The electromechanical resonator according to claim 2, wherein the resonator portion includes a first resonator portion and a second resonator portion, each of which having the fixed electrode and the oscillator; and
    wherein the first gap region of the first resonator portion is different in the width from and the first gap region of the second resonator portion.

14. An electromechanical resonator, comprising:
    a plurality of resonator portions having different resonance frequencies respectively which are formed on a substrate, wherein each of the resonator portions includes a fixed electrode, an oscillator formed separately from the fixed electrode, and a gap between the fixed electrode and the oscillator,
    wherein the gap is vertically divided into a first gap region and a second gap region;
    wherein widths of the first gap region and the second gap region measured at two different heights from the bottom face of the fixed electrode are different; and
    wherein the oscillator has slanted side faces with an inclination angle of less than 90 degrees.

15. The electromechanical resonator according to claim 1, wherein the fixed electrode has a slanted side face and a perpendicular side face,
    wherein the first gap region is located between one of the slanted oscillator side faces and the slanted fixed electrode side face, and
    wherein the second gap region is located between one of the slanted oscillator side faces and the perpendicular fixed electrode side face.

16. The electromechanical resonator according to claim 1, wherein the oscillator has a triangular sectional shape.

17. The electromechanical resonator according to claim 1, wherein the oscillator has a trapezoidal sectional shape.

18. The electromechanical resonator according to claim 1, wherein a thickness of the fixed electrode is greater than a thickness of the oscillator.

* * * * *